(12) United States Patent
Motoyama et al.

(10) Patent No.: US 11,923,246 B2
(45) Date of Patent: Mar. 5, 2024

(54) VIA CD CONTROLLABLE TOP VIA STRUCTURE

(71) Applicant: INTERNATIONAL BUSINESS MACHINES CORPORATION, Armonk, NY (US)

(72) Inventors: Koichi Motoyama, Clifton Park, NY (US); Dominik Metzler, Clifton Park, NY (US); Ekmini Anuja De Silva, Slingerlands, NY (US); Chanro Park, Clifton Park, NY (US); Hsueh-Chung Chen, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 290 days.

(21) Appl. No.: 17/475,463

(22) Filed: Sep. 15, 2021

(65) Prior Publication Data
US 2023/0078008 A1   Mar. 16, 2023

(51) Int. Cl.
*H01L 21/768* (2006.01)
*H01L 23/522* (2006.01)
*H01L 23/528* (2006.01)

(52) U.S. Cl.
CPC .. *H01L 21/76897* (2013.01); *H01L 21/76816* (2013.01); *H01L 21/76885* (2013.01); *H01L 23/5226* (2013.01); *H01L 23/528* (2013.01)

(58) Field of Classification Search
CPC ......... H01L 21/76897; H01L 21/76816; H01L 21/76885; H01L 21/76852; H01L 23/5226; H01L 23/528; H01L 23/53252; H01L 23/5283
See application file for complete search history.

(56) References Cited

U.S. PATENT DOCUMENTS

| 4,536,951 | A |   | 8/1985 | Rhodes et al. |
| 5,693,568 | A |   | 12/1997 | Liu et al. |
| 5,985,752 | A | * | 11/1999 | Chang ............... H01L 21/76885 |
|   |   |   |   | 438/669 |

(Continued)

FOREIGN PATENT DOCUMENTS

EP   0908945 A2   4/1999

OTHER PUBLICATIONS

Authors, et al. Disclosed Anonymously, "Structure and Process for BEOL SAV Integration", IP.com No. IPCOM000213210D, Dec. 8, 2011, pp. 1-4.

(Continued)

*Primary Examiner* — Shahed Ahmed
*Assistant Examiner* — Vicki B. Booker
(74) *Attorney, Agent, or Firm* — Tutunjian & Bitetto, P.C.; Samuel Waldbaum (57) ABSTRACT

A method of via formation including forming a sacrificial mask over a conductive layer, forming a plurality of pillars in the sacrificial mask and the conductive layer, wherein each pillar of the plurality of pillars includes a sacrificial cap and a first conductive via, depositing a spacer between the plurality of pillars, masking at least one of the sacrificial caps, removing at least one of the sacrificial caps to create openings, forming second conductive vias in the openings, and depositing a dielectric coplanar to a top surface of the second conductive vias.

10 Claims, 8 Drawing Sheets

(56) References Cited

U.S. PATENT DOCUMENTS

| | | | |
|---|---|---|---|
| 6,077,733 A | 6/2000 | Chen et al. | |
| 6,096,633 A | 8/2000 | Hsu | |
| 8,062,971 B2 | 11/2011 | Riess et al. | |
| 9,087,844 B2 | 7/2015 | Kim et al. | |
| 9,484,258 B1* | 11/2016 | Kim | H01L 23/528 |
| 9,613,861 B2 | 4/2017 | Anderson et al. | |
| 9,659,821 B1 | 5/2017 | Chen et al. | |
| 9,852,986 B1* | 12/2017 | Stephens | H01L 21/76816 |
| 2002/0155693 A1 | 10/2002 | Hong et al. | |
| 2014/0197538 A1* | 7/2014 | Lu | H01L 21/76892 |
| | | | 257/751 |
| 2015/0056800 A1 | 2/2015 | Mebarki et al. | |
| 2019/0067022 A1* | 2/2019 | Lin | H01L 21/31138 |
| 2019/0164781 A1* | 5/2019 | Tien | H01L 21/76852 |
| 2020/0212189 A1 | 7/2020 | Tan | |
| 2021/0098290 A1 | 4/2021 | Hsueh et al. | |

OTHER PUBLICATIONS

Authors, et al. Disclosed Anonymously, "Via and SVIA Last DD", IP.com No. IPCOM000260927D, Jan. 8, 2020, pp. 1-4.

* cited by examiner

VIA CD CONTROLLABLE TOP VIA STRUCTURE

BACKGROUND

The present invention relates generally to semiconductor devices, and more specifically, to forming a via critical dimension (CD) controllable top via structure through a damascene via scheme.

Aggressive scaling down of integrated circuit (IC) dimensions has introduced increased complexity to the semiconductor manufacturing process and resulted in some issues of the semiconductor device. For example, aggressive scaling down of IC dimensions, i.e., smaller pitches and critical dimensions, has resulted in difficulties to control the distance between the conductive features, particularly the distance between the different levels of conductive features. For example, it has been observed that due to space dimension shrinkage, a via-to-line breakdown may happen in the back-end of line (BEOL) during IC fabrication. The via-to-line breakdown issue may affect the device reliability, for example, reduce the time dependent dielectric breakdown (TDDB) and/or increase the parasitic capacitance of the semiconductor device. Thus, improvements in these areas are desired.

SUMMARY

In accordance with an embodiment, a method of via formation is provided. The method includes forming a sacrificial mask over a conductive layer, forming a plurality of pillars in the sacrificial mask and the conductive layer, wherein each pillar of the plurality of pillars includes a sacrificial cap and a first conductive via, depositing a spacer between the plurality of pillars, masking at least one of the sacrificial caps, removing at least one of the sacrificial caps to create openings, forming second conductive vias in the openings, and depositing a dielectric coplanar to a top surface of the second conductive vias.

In accordance with another embodiment, a semiconductor structure is provided for forming self-aligned vias. The semiconductor structure includes a plurality of pillars, wherein at least one pillar of the plurality of pillars defines a top trapezoid segment and a bottom segment, a metal liner formed over the plurality of pillars, and a dielectric disposed over the metal liner of the plurality of pillars.

In accordance with yet another embodiment, a semiconductor structure is provided for forming self-aligned vias. The semiconductor structure includes a plurality of pillars, wherein at least one pillar of the plurality of pillars defines a top hammer shape segment and a bottom segment, a metal liner formed over the plurality of pillars, and a dielectric disposed over the metal liner of the plurality of pillars.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing a self-aligned via, where the self-aligned via is a critical dimension (CD) controllable top via structure constructed through a damascene via scheme. Via CD control is challenging for damascene via schemes due to a lack of good etch selectivity. As a result, for top via patterning through a damascene via scheme, achieving a self-aligned via and acceptable via CD control can be difficult. To achieve an acceptable self-aligned via for a damascene via scheme, material choice for via patterning becomes necessary. However, even with perfect etch selectivity between a scaffold material and other material where the via is drilled, additional schemes need to be introduced to control (enlarge) the via CD for achieving low via resistance.

Embodiments in accordance with the present invention provide methods and devices for alleviating such issues by forming a unique via profile where the via CD can be controlled by modulating a spacer thickness. This results in a perfectly self-aligned via. The advantages of the structures of the exemplary embodiments are at least the creation of a fully aligned via and line below, maximization of a contact area between the via and the line below without over etching, and the via CD is fully controllable by easily enlarging via mid-CD and top-CD by modulating the spacer thickness without any penalty of self-aligned via (SAV) performance. Additionally, no barrier metal exists at the via bottom since a titanium nitride (TiN) spacer enables metal fill without a barrier layer. Further, there is no line wiggling or via distortion since the line is formed by subtractive etching, and via density and A/R is low enough.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
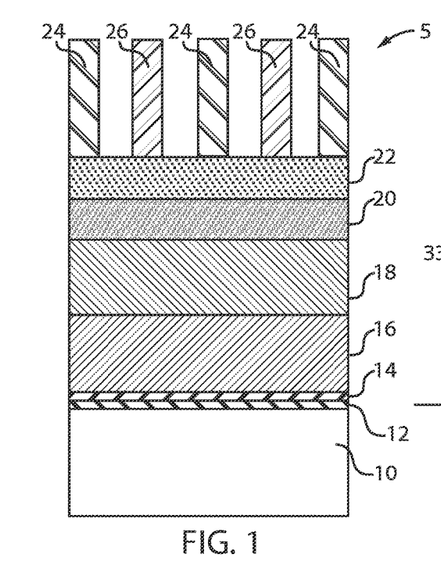
FIG. 1 is a cross-sectional view of a semiconductor stack including a plurality of layers, in accordance with an embodiment of the present invention.

FIG. 1 is a cross-sectional view of a semiconductor stack including a plurality of layers, in accordance with an embodiment of the present invention.

In structure 5, a first metal liner 12 is formed over a substrate 10. A second metal liner 14 is formed over the first metal liner 12. The first metal liner 12 can be, e.g., tantalum (Ta) and the second metal liner 14 can be, e.g., tantalum nitride (TaN).

A conductive layer 16 is formed over the second metal liner 14. The conductive layer 16 can be, e.g., Ruthenium (Ru). The conductive layer 16 can be deposited by, e.g., physical vapor deposition (PVD).

A silicon nitride (SiN) layer 18, a titanium nitride (TiN) layer 20, and an amorphous silicon (a-Si) layer 22 form a stack deposited over the conductive layer 16.

Lines 24, 26 can be patterned over the stack of layers 18, 20, 22. Lines 24 can be SiN lines, whereas lines 26 can be spin-on-glass (SOG) insulator lines.

The stack of layers 18, 20, 22 and lines 24, 26 can be employed to pattern the metal lines of FIG. 2, as described below.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include a layered semiconductor such as, for example, Si/SiGe, a silicon-on-insulator or a SiGe-on-insulator.

Figure 2:
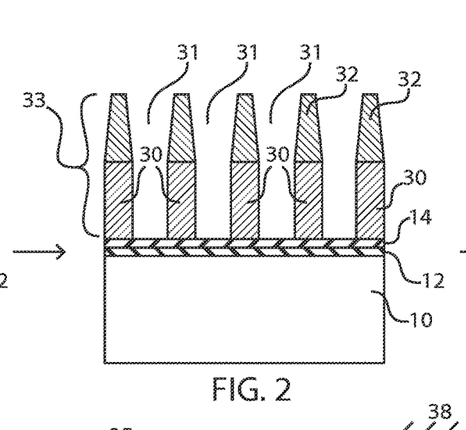
FIG. 2 is a cross-sectional view of the semiconductor structure of FIG. 1 where the semiconductor stack is etched to form conductive lines with a tapered hardmask thereon, in accordance with an embodiment of the present invention.

FIG. 2 is a cross-sectional view of the semiconductor structure of FIG. 1 where the semiconductor stack is etched to form conductive lines with a tapered hardmask thereon, in accordance with an embodiment of the present invention.

The patterning of FIG. 1 results in metal lines 30 being formed. A hardmask 32 remains over each of the metal lines 30. The hardmask 32 has a tapered or conical configuration and can be referred to as a sacrificial cap. The metal lines 30 can be referred to as ruthenium (Ru) lines. The Ru lines 30 with the hardmask 32 can be referred to as pillars 33. Openings 31 are defined between pillars 33.

Figure 3:
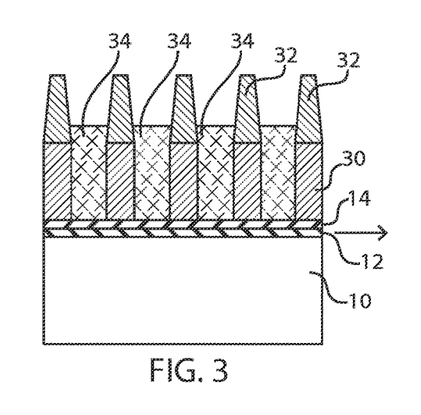
FIG. 3 is a cross-sectional view of the semiconductor structure of FIG. 2 where a first spacer is deposited, in accordance with an embodiment of the present invention.

FIG. 3 is a cross-sectional view of the semiconductor structure of FIG. 2 where a first spacer is deposited, in accordance with an embodiment of the present invention.

A first spacer 34 is deposited between the pillars 33. The first spacer 34 directly contacts entire sidewalls of the Ru lines 30. The first spacer 34 directly contacts only a lower portion of the sidewalls of the hardmasks 32.

The first spacer 34 can be, e.g., a spin-on titanium oxide (TiOx) material.

Figure 4:
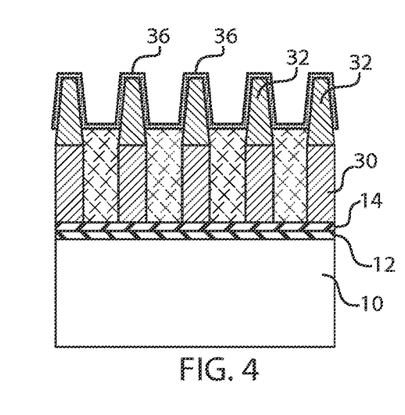
FIG. 4 is a cross-sectional view of the semiconductor structure of FIG. 3 where a second spacer is deposited, in accordance with an embodiment of the present invention.

FIG. 4 is a cross-sectional view of the semiconductor structure of FIG. 3 where a second spacer is deposited, in accordance with an embodiment of the present invention.

A second spacer 36 is deposited over the first spacer 34. The second spacer 36 has a wave-like configuration. The second spacer 36 directly contacts the top surface of the first spacer 34 and the top surface and sidewalls of the hardmasks 32.

The second spacer 36 can be, e.g., a SiN spacer.

Figure 5:
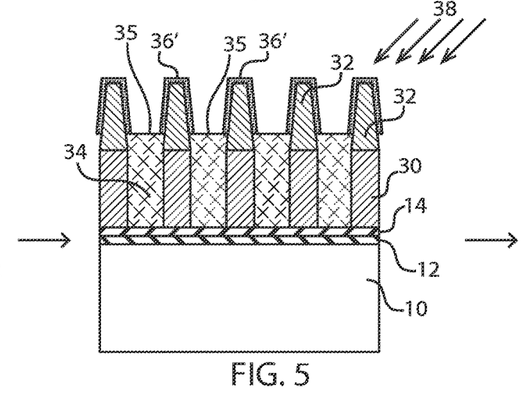
FIG. 5 is a cross-sectional view of the semiconductor structure of FIG. 4 where the second spacer is etched back to expose top surfaces of the first spacer, in accordance with an embodiment of the present invention.

FIG. 5 is a cross-sectional view of the semiconductor structure of FIG. 4 where the second spacer is etched back to expose top surfaces of the first spacer, in accordance with an embodiment of the present invention.

The second spacer 36 is etched via an etchant 38 to form second spacer segments or sections 36'. The second spacer sections 36' have a substantially or generally conical shape or configuration.

The etching of the second spacer 36 results in the exposure of the top surface 35 of the first spacer 34 between the second spacer sections 36'.

Figure 6:
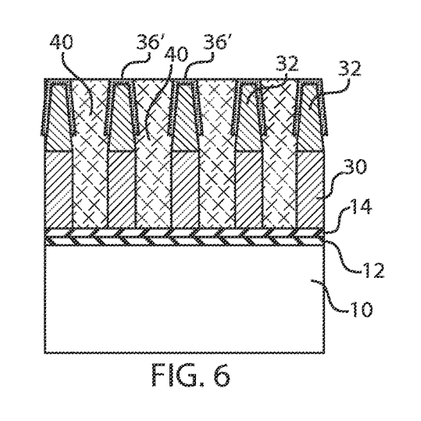
FIG. 6 is a cross-sectional view of the semiconductor structure of FIG. 5 where a third spacer is deposited over the first and second spacer portions, in accordance with an embodiment of the present invention.

FIG. 6 is a cross-sectional view of the semiconductor structure of FIG. 5 where a third spacer is deposited over the first and second spacer portions, in accordance with an embodiment of the present invention.

A third spacer 40 is deposited over the first spacer 34 and the second spacer sections 36'.

The third spacer 40 can be, e.g., a spin-on titanium oxide (TiOx) material or TiN. The TiN can be deposited by, e.g., ALD.

The third spacer 40 is planarized such that a top surface of the third spacer 40 is flush with the top surface of the second spacer sections 36'.

Figure 7:
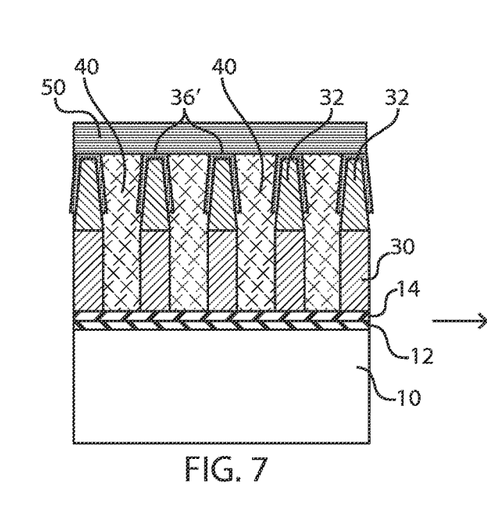
FIG. 7 is a cross-sectional view of the semiconductor structure of FIG. 6 where an insulator fill takes place, in accordance with an embodiment of the present invention.

FIG. 7 is a cross-sectional view of the semiconductor structure of FIG. 6 where an insulator fill takes place, in accordance with an embodiment of the present invention.

An insulator fill takes place. The insulator fill 50 can be a spin-on-glass (SOG) insulator fill.

Figure 8:
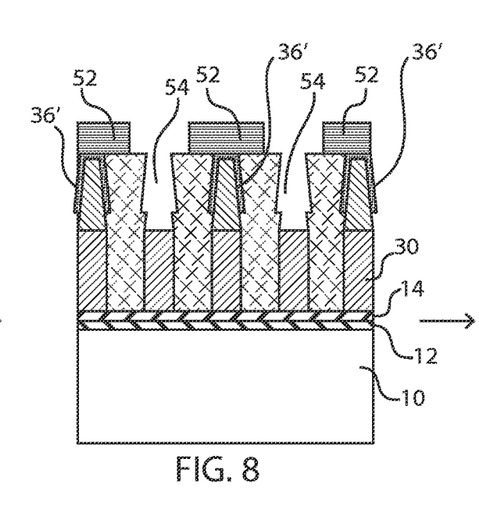
FIG. 8 is a cross-sectional view of the semiconductor structure of FIG. 7 where via patterning takes place creating openings over one or more of the conductive lines, in accordance with an embodiment of the present invention.

FIG. 8 is a cross-sectional view of the semiconductor structure of FIG. 7 where via patterning takes place creating openings over one or more of the conductive lines, in accordance with an embodiment of the present invention.

Via patterning is performed such that portions of the insulator fill 50 are removed and openings 54 are created. Remaining insulator fill portions 52 remain over the hardmasks 32.

Figure 9:
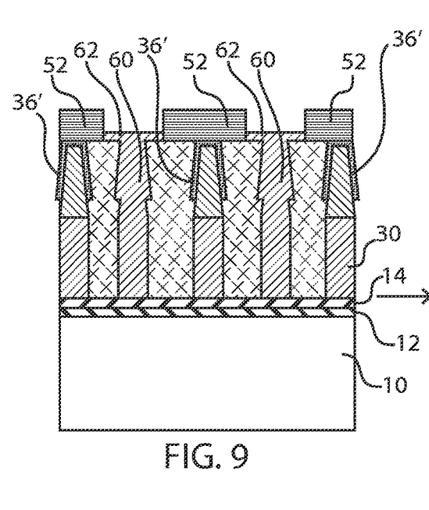
FIG. 9 is a cross-sectional view of the semiconductor structure of FIG. 8 where a metal fill takes place to fill the openings, in accordance with an embodiment of the present invention.

FIG. 9 is a cross-sectional view of the semiconductor structure of FIG. 8 where a metal fill takes place to fill the openings, in accordance with an embodiment of the present invention.

A metal fill takes place creating a first metal fill portion 60 and a second metal fill portion 62. The first metal fill portion 60 has a trapezoidal shape, whereas the second metal fill portion 62 has a rectangular shape. The metal fill portions 60, 62 can be, e.g., Ru.

In other exemplary embodiments, the conductive material of the metal fill portions 60, 62 can be copper (Cu), cobalt (Co), aluminum (Al), platinum (Pt), gold (Au), tungsten (W), titanium (Ti), or any combination thereof. The metal fill portions 60, 62 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

Figure 10:
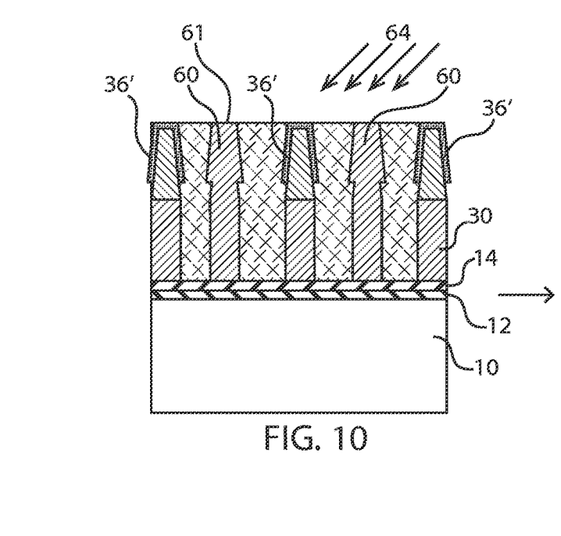
FIG. 10 is a cross-sectional view of the semiconductor structure of FIG. 9 where planarization is performed to removal the insulator fill and a top portion of the metal fill, in accordance with an embodiment of the present invention.

FIG. 10 is a cross-sectional view of the semiconductor structure of FIG. 9 where planarization is performed to removal the insulator fill and a top portion of the metal fill, in accordance with an embodiment of the present invention.

Planarization 64 can be performed to remove the metal fill portion 62, as well as the remaining insulator fill portions 52. Thus, a top surface 61 of the first metal fill portion 60 is exposed. Planarization can occur by, e.g., chemical mechanical planarization (CMP).

Figure 11:
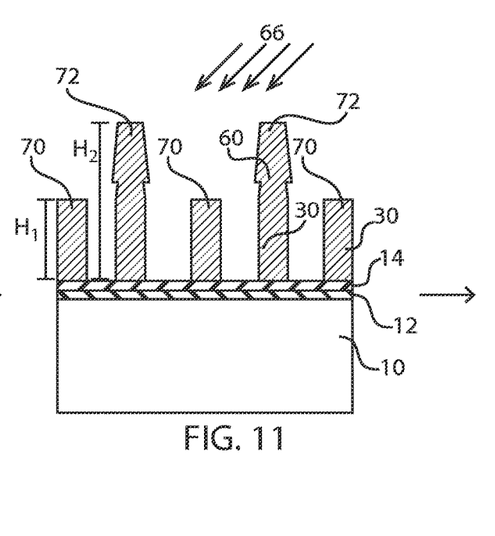
FIG. 11 is a cross-sectional view of the semiconductor structure of FIG. 10 where the remaining first, second, and third spacer portions are removed, in accordance with an embodiment of the present invention.

FIG. 11 is a cross-sectional view of the semiconductor structure of FIG. 10 where the remaining first, second, and third spacer portions are removed, in accordance with an embodiment of the present invention.

An etch 66 is performed to remove remaining first, second, and third spacers portions 34, 36', 40, as well as the hardmasks 32. This results in Ru lines 70, 72. Ru lines 70 are rectangular shaped lines having a height $H_1$, whereas Ru lines 72 have a trapezoidal upper portion and have a total height of $H_2$, where $H_2 > H_1$.

The etching 66 can be, e.g., a reactive ion etch (RIE) or the like. In other embodiments, the etching can include a dry etching process such as, for example, reactive ion etching, plasma etching, ion etching or laser ablation. The etching can further include a wet chemical etching process in which one or more chemical etchants are employed to remove portions of the layers.

In other exemplary embodiments, etching or recessing 66 can be performed by wet etch processing. In one example, a vertical wet etch can be employed to define the channel length. Non-limiting examples of wet etch processes that can be used to form the recess include hydrogen peroxide ($H_2O_2$), potassium hydroxide (KOH), ammonium hydroxide (ammonia), tetramethylammonium hydroxide (TMAH), hydrazine, or ethylene diamine pyrocatechol (EDP), or any combination thereof.

Figure 12:
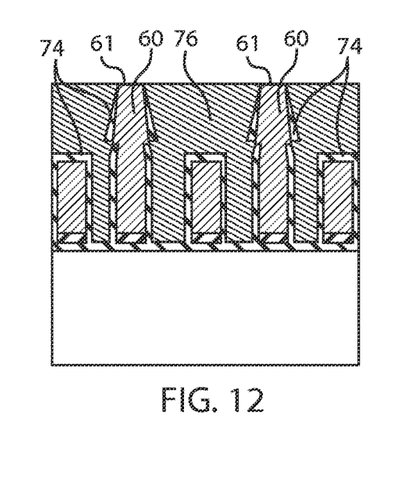
FIG. 12 is a cross-sectional view of the semiconductor structure of FIG. 11 where a metal liner and a liquid flowable chemical vapor deposition (CVD) are deposited, in accordance with an embodiment of the present invention.

FIG. 12 is a cross-sectional view of the semiconductor structure of FIG. 11 where a metal liner and a liquid flowable chemical vapor deposition (CVD) are deposited, in accordance with an embodiment of the present invention.

A metal liner 74 is deposited over the Ru lines 70, 72. The metal liner 74 can be, e.g., TaN. The metal liner 74 can be constructed from other metals, such as, for example, TaN/Ta, titanium, titanium nitride, cobalt, ruthenium, and manganese.

A liquid flowable chemical vapor deposition (fCVD) 76 can then be deposited. A top surface 61 of the first metal fill portion 60 remains exposed. The top surface 61 of the metal line 60 is coplanar with the dielectric 76.

Thus, FIG. 12 illustrates a self-aligned via with a trapezoid shape via structure.

CVD involves exposing a substrate (e.g., a wafer) to one or more precursors, which react to deposit a film on a substrate. Flowable chemical vapor deposition (fCVD) is a type of CVD that enables the deposition of flowable films, particularly for gap fill applications. Such methods generally relate to filling gaps on substrates with a solid dielectric material by forming a flowable liquid film in the gap. The flowable film is formed by reacting a dielectric precursor which may have a Si—C bond with an oxidant to form the dielectric material. In certain embodiments, the dielectric precursor condenses and subsequently reacts with the oxidant to form dielectric material. In certain embodiments, vapor phase reactants react to form a condensed flowable film.

Figures 13, 14:
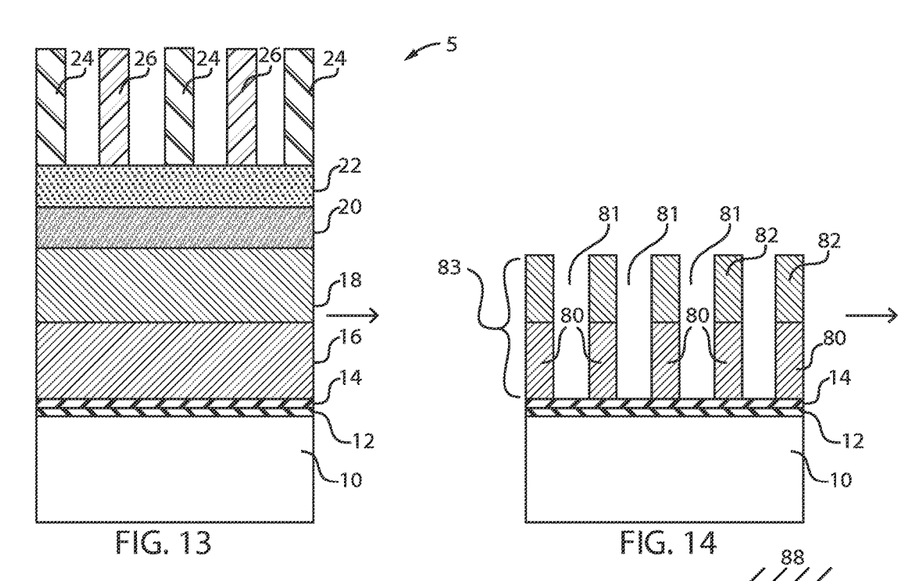
FIG. 13 a cross-sectional view of a semiconductor stack including a plurality of layers, in accordance with another embodiment of the present invention.
FIG. 14 is a cross-sectional view of the semiconductor structure of FIG. 13 where the semiconductor stack is etched to form conductive lines with a non-tapered hardmask thereon, in accordance with an embodiment of the present invention.

FIG. 13 a cross-sectional view of a semiconductor stack including a plurality of layers, in accordance with another embodiment of the present invention.

FIG. 13 is the same as FIG. 1 and its description will be omitted for sake of clarity.

FIG. 14 is a cross-sectional view of the semiconductor structure of FIG. 13 where the semiconductor stack is etched to form conductive lines with a non-tapered hardmask thereon, in accordance with an embodiment of the present invention.

The patterning of FIG. 13 results in metal lines 80 being formed. A hardmask 82 remains over each of the metal lines 80. The hardmask 82 has a non-tapered configuration, as opposed to the hardmask 32 in FIG. 2, and can be referred to as a sacrificial cap. The hardmask 82 has a rectangular shape. The metal lines 80 can be referred to as ruthenium (Ru) lines. The Ru lines 80 with the hardmask 82 can be referred to as pillars 83. Openings 81 are defined between pillars 83.

Figure 15:
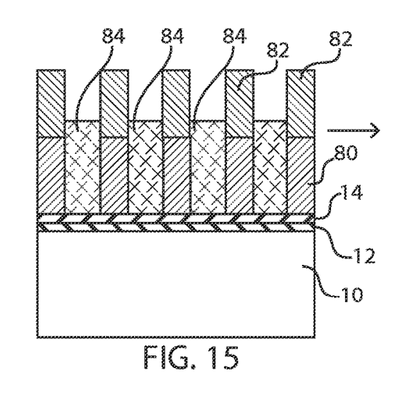
FIG. 15 is a cross-sectional view of the semiconductor structure of FIG. 14 where a first spacer is deposited, in accordance with an embodiment of the present invention.

FIG. 15 is a cross-sectional view of the semiconductor structure of FIG. 14 where a first spacer is deposited, in accordance with an embodiment of the present invention.

A first spacer 84 is deposited between the pillars 83. The first spacer 84 directly contacts entire sidewalls of the Ru lines 80. The first spacer 84 directly contacts only a lower portion of the sidewalls of the hardmasks 82.

The first spacer 84 can be, e.g., a spin-on titanium oxide (TiOx) material.

Figure 16:
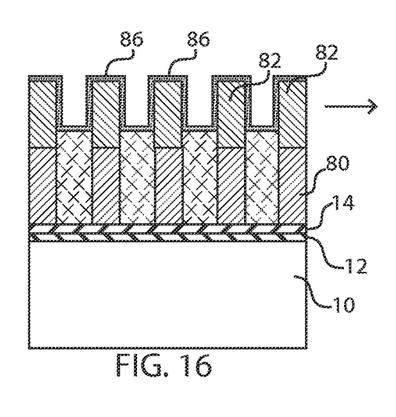
FIG. 16 is a cross-sectional view of the semiconductor structure of FIG. 15 where a second spacer is deposited, in accordance with an embodiment of the present invention.

FIG. 16 is a cross-sectional view of the semiconductor structure of FIG. 15 where a second spacer is deposited, in accordance with an embodiment of the present invention.

A second spacer 86 is deposited over the first spacer 84. The second spacer 86 has a wave-like configuration. The second spacer 86 directly contacts the hardmasks 82 and further directly contacts the top surface of the first spacer 84.

The second spacer 86 can be, e.g., a SiN spacer.

Figure 17:
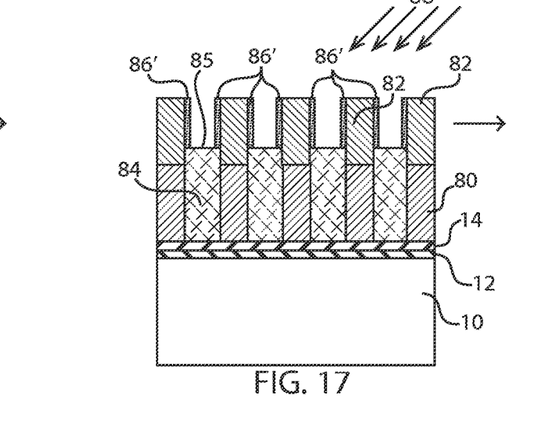
FIG. 17 is a cross-sectional view of the semiconductor structure of FIG. 16 where the second spacer is etched back to expose top surfaces of the first spacer, in accordance with an embodiment of the present invention.

FIG. 17 is a cross-sectional view of the semiconductor structure of FIG. 16 where the second spacer is etched back to expose top surfaces of the first spacer, in accordance with an embodiment of the present invention.

The second spacer 86 is etched via an etchant 88 to form second spacer segments or sections 86'. The second spacer sections 86' have a substantially linear shape. The second spacer sections 86' are positioned on opposed ends of the hardmask 82.

The etching of the second spacer 36 results in the exposure of the top surface 85 of the first spacer 84 between the second spacer sections 86'.

Figure 18:
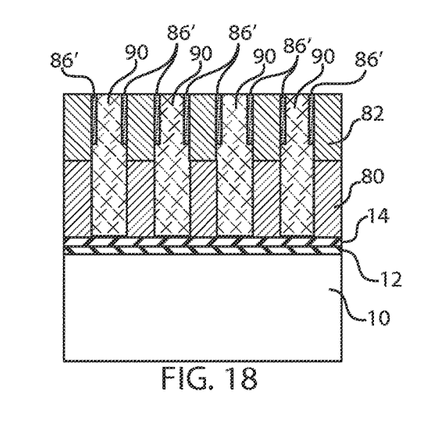
FIG. 18 is a cross-sectional view of the semiconductor structure of FIG. 17 where a third spacer is deposited over the first and second spacer portions, in accordance with an embodiment of the present invention.

FIG. 18 is a cross-sectional view of the semiconductor structure of FIG. 17 where a third spacer is deposited over the first and second spacer portions, in accordance with an embodiment of the present invention.

A third spacer 90 is deposited over the first spacer 84 and the second spacer sections 86'.

The third spacer 90 can be, e.g., a spin-on titanium oxide (TiOx) material or TiN. The TiN can be deposited by, e.g., ALD.

The third spacer 90 is planarized such that a top surface of the third spacer 90 is flush with the top surface of the second spacer sections 86'.

Figure 19:
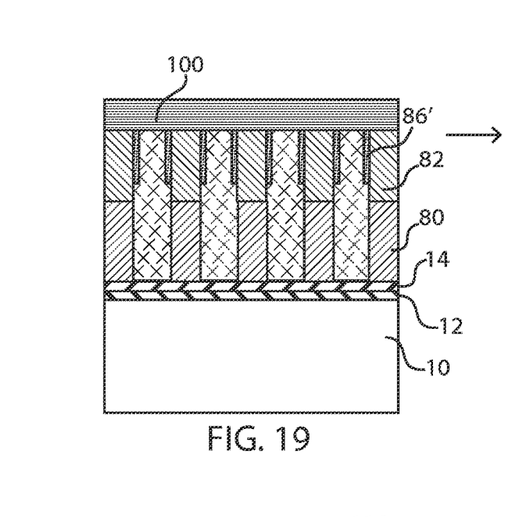
FIG. 19 is a cross-sectional view of the semiconductor structure of FIG. 18 where an insulator fill takes place, in accordance with an embodiment of the present invention.

FIG. 19 is a cross-sectional view of the semiconductor structure of FIG. 18 where an insulator fill takes place, in accordance with an embodiment of the present invention.

An insulator fill takes place. The insulator fill 100 can be a spin-on-glass (SOG) insulator fill.

Figure 20:
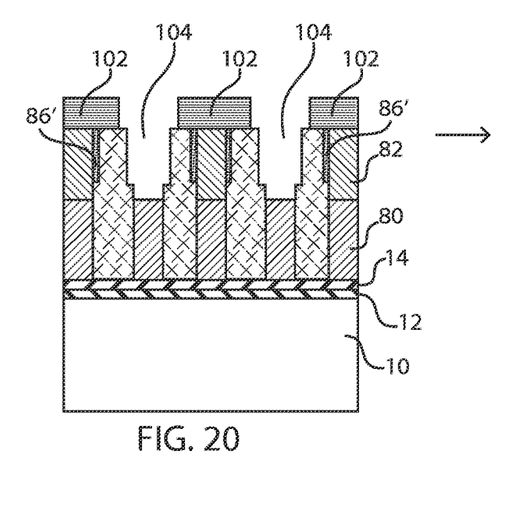
FIG. 20 is a cross-sectional view of the semiconductor structure of FIG. 19 where via patterning takes place creating openings over one or more of the conductive lines, in accordance with an embodiment of the present invention.

FIG. 20 is a cross-sectional view of the semiconductor structure of FIG. 19 where via patterning takes place creating openings over one or more of the conductive lines, in accordance with an embodiment of the present invention.

Via patterning is performed such that portions of the insulator fill 100 are removed and openings 104 are created. Remaining insulator fill portions 102 remain over the hardmasks 82.

Figure 21:
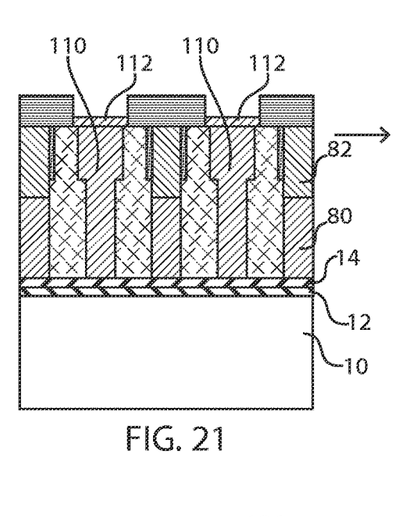
FIG. 21 is a cross-sectional view of the semiconductor structure of FIG. 20 where a metal fill takes place to fill the openings, in accordance with an embodiment of the present invention.

FIG. 21 is a cross-sectional view of the semiconductor structure of FIG. 20 where a metal fill takes place to fill the openings, in accordance with an embodiment of the present invention.

A metal fill takes place creating a first metal fill portion 110 and a second metal fill portion 112. The first metal fill portion 110 has a rectangular shape and the second metal fill portion 112 also has a rectangular shape. The second metal fill portion 112 is elongated such that it rests over the first metal fill portion 110. The second metal fill portion 112 contacts sidewalls of the remaining insulator fill portions 102. The metal fill portions 110, 112 can be, e.g., Ru.

In other exemplary embodiments, the conductive material of the metal fill portions 110, 112 can be copper (Cu), cobalt (Co), aluminum (Al), platinum (Pt), gold (Au), tungsten (W), titanium (Ti), or any combination thereof. The metal fill portions 110, 112 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

Figure 22:
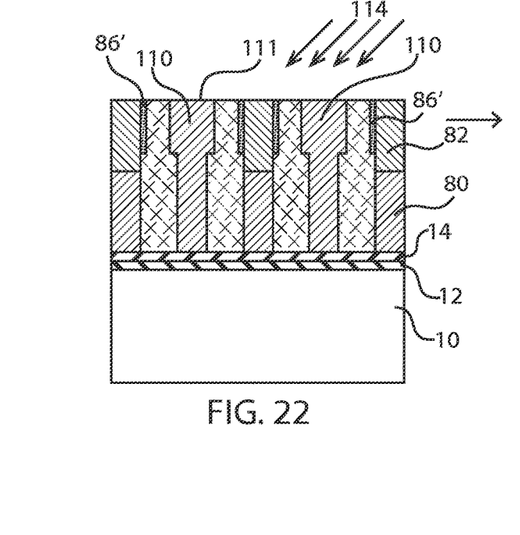
FIG. 22 is a cross-sectional view of the semiconductor structure of FIG. 21 where planarization is performed to removal the insulator fill and a top portion of the metal fill, in accordance with an embodiment of the present invention.

FIG. 22 is a cross-sectional view of the semiconductor structure of FIG. 21 where planarization is performed to removal the insulator fill and a top portion of the metal fill, in accordance with an embodiment of the present invention.

Planarization 114 can be performed to remove the metal fill portion 112, as well as the remaining insulator fill portions 102. Thus, a top surface 111 of the first metal fill portion 110 is exposed. Planarization can occur by, e.g., chemical mechanical planarization (CMP).

Figure 23:
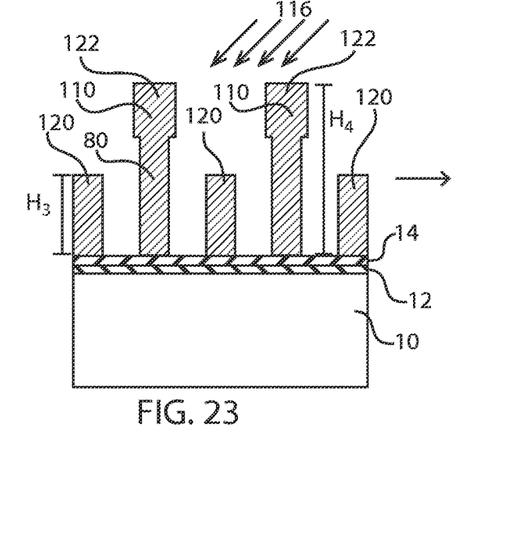
FIG. 23 is a cross-sectional view of the semiconductor structure of FIG. 22 where the remaining first, second, and third spacer portions are removed, in accordance with an embodiment of the present invention.

FIG. 23 is a cross-sectional view of the semiconductor structure of FIG. 22 where the remaining first, second, and third spacer portions are removed, in accordance with an embodiment of the present invention.

An etch 116 is performed to remove remaining first, second, and third spacers portions 84, 86',90, as well as the hardmasks 82. This results in Ru lines 120, 122. Ru lines 120 are rectangular shaped lines having a height $H_3$, whereas Ru lines 122 have a rectangular upper portion and have a total height of $H_4$, where $H_4 > H_3$.

Etching or recessing 116 can be performed by wet etch processing. In one example, a vertical wet etch can be employed to define the channel length. Non-limiting examples of wet etch processes that can be used to form the recess include hydrogen peroxide ($H_2O_2$), potassium hydroxide (KOH), ammonium hydroxide (ammonia), tetramethylammonium hydroxide (TMAH), hydrazine, or ethylene diamine pyrocatechol (EDP), or any combination thereof.

Figure 24:
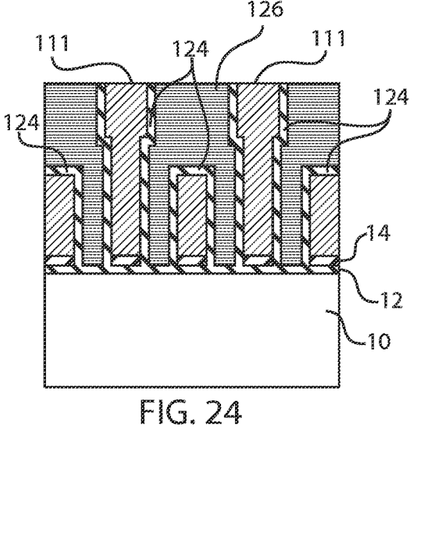
FIG. 24 is a cross-sectional view of the semiconductor structure of FIG. 23 where a metal liner and a liquid flowable chemical vapor deposition (CVD) are deposited, in accordance with an embodiment of the present invention.

FIG. 24 is a cross-sectional view of the semiconductor structure of FIG. 23 where a metal liner and a liquid flowable chemical vapor deposition (CVD) are deposited, in accordance with an embodiment of the present invention.

A metal liner 124 is deposited over the Ru lines 120, 122. The metal liner 124 can be, e.g., TaN. The metal liner 124 can be constructed from other metals, such as, for example, TaN/Ta, titanium, titanium nitride, cobalt, ruthenium, and manganese.

A liquid flowable chemical vapor deposition (fCVD) 126 can then be deposited. A top surface 111 of the first metal fill portion 110 remains exposed. The top surface 111 of the metal line 110 is coplanar with the dielectric 126.

Thus, FIG. 24 illustrates a self-aligned via with a rectangle shape via structure.

Figure 25:
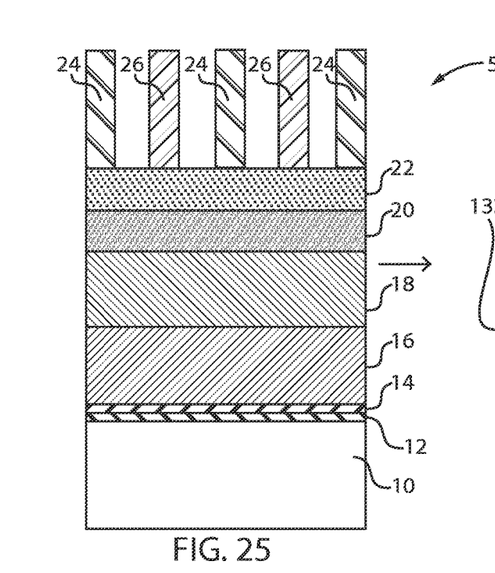
FIG. 25 a cross-sectional view of a semiconductor stack including a plurality of layers, in accordance with another embodiment of the present invention.

FIG. 25 a cross-sectional view of a semiconductor stack including a plurality of layers, in accordance with another embodiment of the present invention.

FIG. 25 is the same as FIGS. 1 and 13, and its description will be omitted for sake of clarity.

Figure 26:
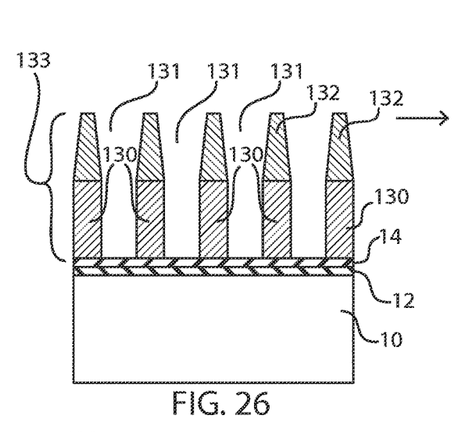
FIG. 26 is a cross-sectional view of the semiconductor structure of FIG. 25 where the semiconductor stack is etched to form conductive lines with a tapered hardmask thereon, in accordance with an embodiment of the present invention.

FIG. 26 is a cross-sectional view of the semiconductor structure of FIG. 25 where the semiconductor stack is etched to form conductive lines with a tapered hardmask thereon, in accordance with an embodiment of the present invention.

The patterning of FIG. 25 results in metal lines 130 being formed. A hardmask 132 remains over each of the metal lines 130. The hardmask 132 has a tapered or conical configuration and can be referred to as a sacrificial cap. The metal lines 130 can be referred to as ruthenium (Ru) lines. The Ru lines 130 with the hardmask 132 can be referred to as pillars 133. Openings 131 are defined between pillars 133.

Figure 27:
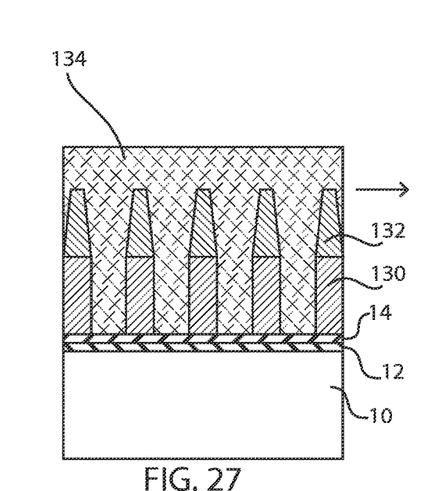
FIG. 27 is a cross-sectional view of the semiconductor structure of FIG. 26 where a spacer is deposited, in accordance with an embodiment of the present invention.

FIG. 27 is a cross-sectional view of the semiconductor structure of FIG. 26 where a spacer is deposited, in accordance with an embodiment of the present invention.

A spacer 134 is deposited between the pillars 133. The spacer 134 completely encompasses the Ru lines 130 and the hardmasks 132.

Figure 28:
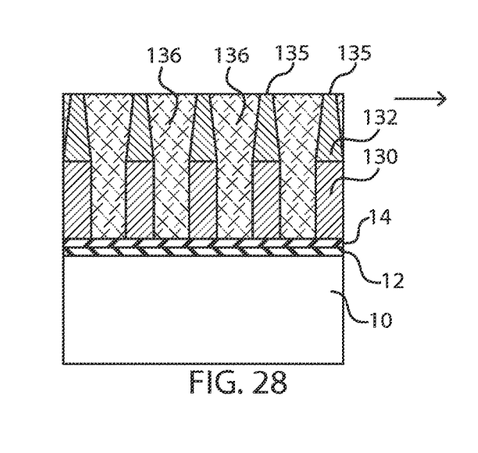
FIG. 28 is a cross-sectional view of the semiconductor structure of FIG. 27 where the spacer is etched back to expose top surfaces of the spacer, in accordance with an embodiment of the present invention.

FIG. 28 is a cross-sectional view of the semiconductor structure of FIG. 27 where the spacer is etched back to expose top surfaces of the spacer, in accordance with an embodiment of the present invention.

The spacer 134 is planarized such that a top surface of the spacer 134 is flush with a top surface 135 of the hardmask 132. The remaining spacer is designated as 136.

Figure 29:
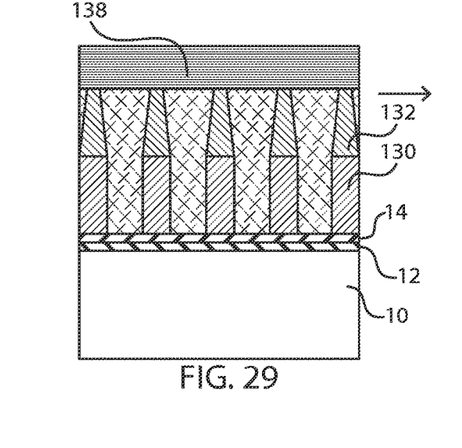
FIG. 29 is a cross-sectional view of the semiconductor structure of FIG. 28 where an insulator fill takes place, in accordance with an embodiment of the present invention.

FIG. 29 is a cross-sectional view of the semiconductor structure of FIG. 28 where an insulator fill takes place, in accordance with an embodiment of the present invention.

An insulator fill takes place. The insulator fill 138 can be a spin-on-glass (SOG) insulator fill.

Figure 30:
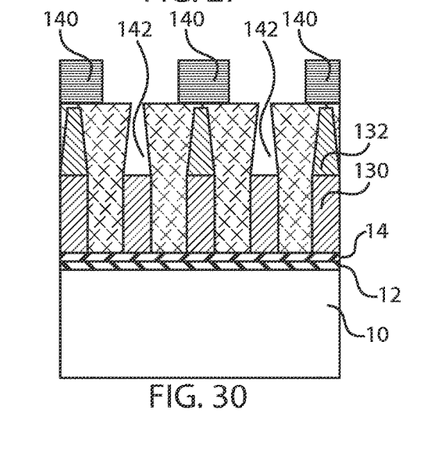
FIG. 30 is a cross-sectional view of the semiconductor structure of FIG. 29 where via patterning takes place creating openings over one or more of the conductive lines, in accordance with an embodiment of the present invention.

FIG. 30 is a cross-sectional view of the semiconductor structure of FIG. 29 where via patterning takes place creating openings over one or more of the conductive lines, in accordance with an embodiment of the present invention.

Via patterning is performed such that portions of the insulator fill 138 are removed and openings 142 are created. Remaining insulator fill portions 140 remain.

Figure 31:
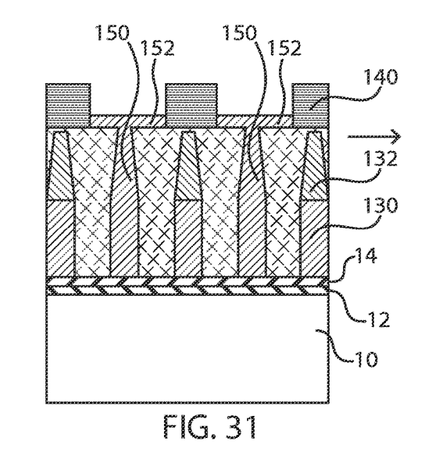
FIG. 31 is a cross-sectional view of the semiconductor structure of FIG. 30 where a metal fill takes place to fill the openings, in accordance with an embodiment of the present invention.

FIG. 31 is a cross-sectional view of the semiconductor structure of FIG. 30 where a metal fill takes place to fill the openings, in accordance with an embodiment of the present invention.

A metal fill takes place creating a first metal fill portion 150 and a second metal fill portion 152. The first metal fill portion 150 has a conical shape, whereas the second metal fill portion 152 has a rectangular shape. The metal fill portions 150, 152 can be, e.g., Ru.

In other exemplary embodiments, the conductive material of the metal fill portions 150, 152 can be copper (Cu), cobalt (Co), aluminum (Al), platinum (Pt), gold (Au), tungsten (W), titanium (Ti), or any combination thereof. The metal fill portions 150, 152 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

Figure 32:
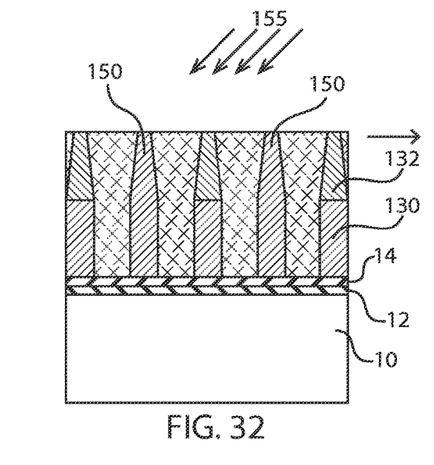
FIG. 32 is a cross-sectional view of the semiconductor structure of FIG. 31 where planarization is performed to removal the insulator fill and a top portion of the metal fill, in accordance with an embodiment of the present invention.

FIG. 32 is a cross-sectional view of the semiconductor structure of FIG. 31 where planarization is performed to removal the insulator fill and a top portion of the metal fill, in accordance with an embodiment of the present invention.

Planarization 155 can be performed to remove the metal fill portion 152, as well as the remaining insulator fill portions 140. Thus, a top surface of the first metal fill portion 150 is exposed. Planarization can occur by, e.g., chemical mechanical planarization (CMP).

Figure 33:
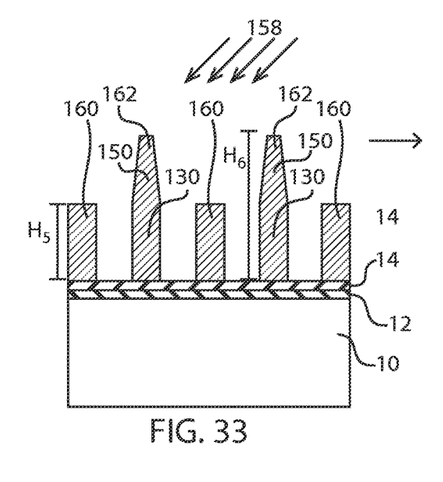
FIG. 33 is a cross-sectional view of the semiconductor structure of FIG. 32 where the remaining first spacer portions are removed, in accordance with an embodiment of the present invention.

FIG. 33 is a cross-sectional view of the semiconductor structure of FIG. 32 where the spacer portions are removed, in accordance with an embodiment of the present invention.

An etch 158 is performed to remove spacer portions 136, as well as the hardmasks 132. This results in Ru lines 160, 162. Ru lines 160 are rectangular shaped lines having a height $H_5$, whereas Ru lines 162 have a conical upper portion and have a total height of $H_6$, where $H_6 > H_5$.

Etching or recessing 158 can be performed by wet etch processing, as discussed above.

Figure 34:
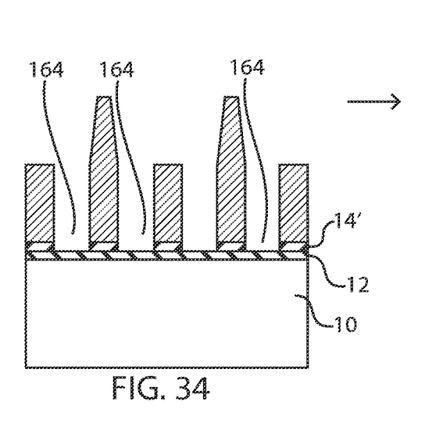
FIG. 34 is a cross-sectional view of the semiconductor structure of FIG. 23 where a TaN liner of the semiconductor stack is etched, in accordance with an embodiment of the present invention.

FIG. 34 is a cross-sectional view of the semiconductor structure of FIG. 23 where a TaN liner of the semiconductor stack is etched, in accordance with an embodiment of the present invention.

Etching 164 of the TaN liner 14 takes place resulting in TaN liner sections 14' remaining.

Figure 35:
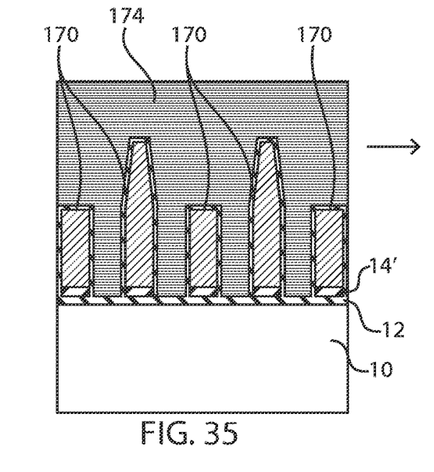
FIG. 35 is a cross-sectional view of the semiconductor structure of FIG. 34 where a metal liner and a liquid flowable CVD are deposited, in accordance with an embodiment of the present invention.

FIG. 35 is a cross-sectional view of the semiconductor structure of FIG. 34 where a metal liner and a liquid flowable CVD are deposited, in accordance with an embodiment of the present invention.

A metal liner 170 is deposited over the Ru lines 160, 162. The metal liner 170 can be, e.g., TaN. The metal liner 170 can be constructed from other metals, such as, for example, TaN/Ta, titanium, titanium nitride, cobalt, ruthenium, and manganese.

A liquid flowable chemical vapor deposition (fCVD) 174 can then be deposited.

Figure 36:
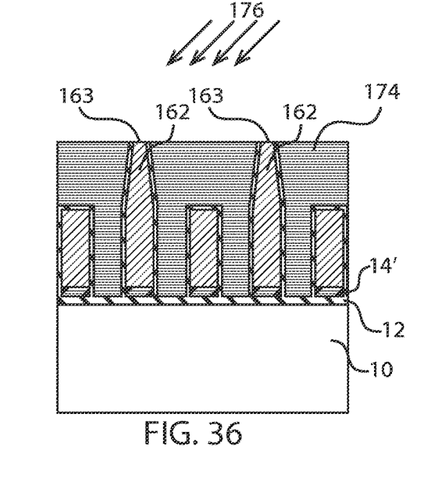
FIG. 36 is a cross-sectional view of the semiconductor structure of FIG. 35 where the liquid flowable CVD is planarized to expose a top surface of one or more of the metal lines, in accordance with an embodiment of the present invention.

FIG. 36 is a cross-sectional view of the semiconductor structure of FIG. 35 where the liquid flowable CVD is planarized to expose a top surface of one or more of the metal lines, in accordance with an embodiment of the present invention.

Planarization 176 is performed to expose a top surface 163 of the conical Ru lines 162. The top surface 163 of the metal line 162 is coplanar with the dielectric 174.

Thus, FIG. 36 illustrates a self-aligned via with a conical shape via structure.

Figure 37:
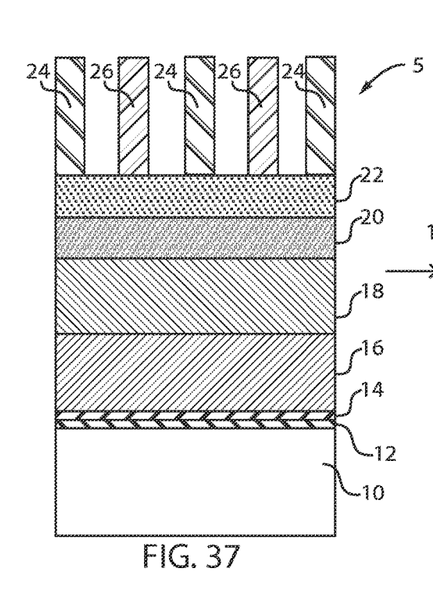
FIG. 37 a cross-sectional view of a semiconductor stack including a plurality of layers, in accordance with another embodiment of the present invention.

FIG. 37 a cross-sectional view of a semiconductor stack including a plurality of layers, in accordance with another embodiment of the present invention.

FIG. 37 is the same as FIGS. 1, 13, and 25, and its description will be omitted for sake of clarity.

Figure 38:
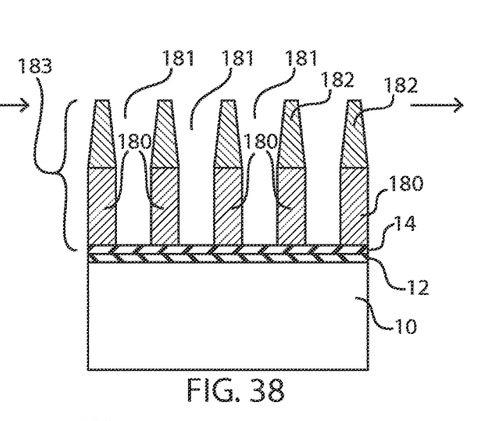
FIG. 38 is a cross-sectional view of the semiconductor structure of FIG. 37 where the semiconductor stack is etched to form conductive lines with a tapered hardmask thereon, in accordance with an embodiment of the present invention.

FIG. 38 is a cross-sectional view of the semiconductor structure of FIG. 37 where the semiconductor stack is etched to form conductive lines with a tapered hardmask thereon, in accordance with an embodiment of the present invention.

The patterning of FIG. 37 results in metal lines 180 being formed. A hardmask 182 remains over each of the metal lines 180. The hardmask 182 has a tapered or conical configuration and can be referred to as a sacrificial cap. The metal lines 180 can be referred to as ruthenium (Ru) lines. The Ru lines 180 with the hardmask 182 can be referred to as pillars 183. Openings 181 are defined between pillars 183.

Figure 39:
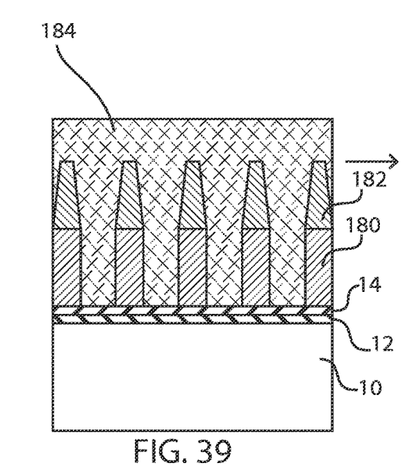
FIG. 39 is a cross-sectional view of the semiconductor structure of FIG. 38 where a spacer is deposited, in accordance with an embodiment of the present invention.

FIG. 39 is a cross-sectional view of the semiconductor structure of FIG. 38 where a spacer is deposited, in accordance with an embodiment of the present invention.

A spacer 184 is deposited between the pillars 183. The spacer 184 completely encompasses the Ru lines 180 and the hardmasks 182.

Figure 40:
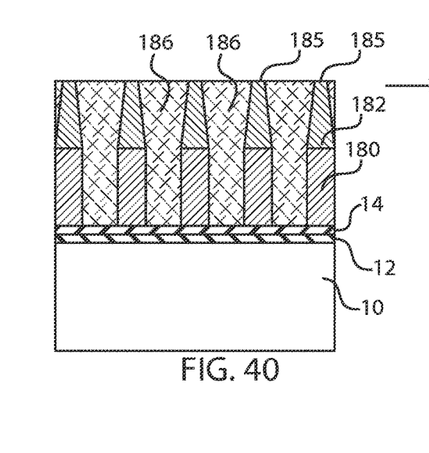
FIG. 40 is a cross-sectional view of the semiconductor structure of FIG. 39 where the spacer is etched back to expose top surfaces of the spacer, in accordance with an embodiment of the present invention.

FIG. 40 is a cross-sectional view of the semiconductor structure of FIG. 39 where the spacer is etched back to expose top surfaces of the spacer, in accordance with an embodiment of the present invention.

The spacer 184 is planarized such that a top surface of the spacer 184 is flush with a top surface 185 of the hardmask 182. The remaining spacer is designated as 186.

Figure 41:
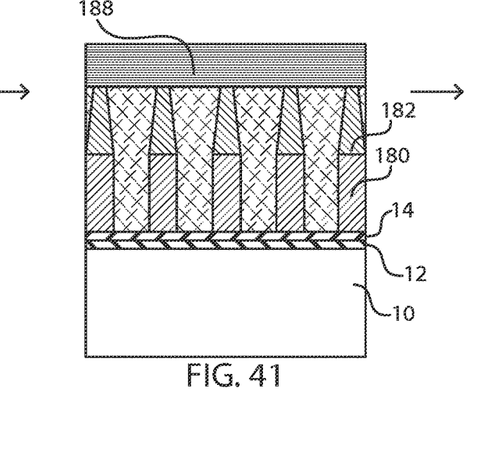
FIG. 41 is a cross-sectional view of the semiconductor structure of FIG. 40 where an insulator fill takes place, in accordance with an embodiment of the present invention.

FIG. 41 is a cross-sectional view of the semiconductor structure of FIG. 40 where an insulator fill takes place, in accordance with an embodiment of the present invention.

An insulator fill takes place. The insulator fill 188 can be a spin-on-glass (SOG) insulator fill.

Figure 42:
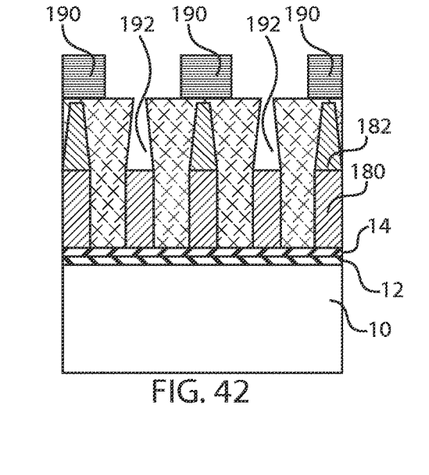
FIG. 42 is a cross-sectional view of the semiconductor structure of FIG. 41 where via patterning takes place creating openings over one or more of the conductive lines, in accordance with an embodiment of the present invention.

FIG. 42 is a cross-sectional view of the semiconductor structure of FIG. 41 where via patterning takes place creating openings over one or more of the conductive lines, in accordance with an embodiment of the present invention.

Via patterning is performed such that portions of the insulator fill 188 are removed and openings 192 are created. Remaining insulator fill portions 190 remain.

Figure 43:
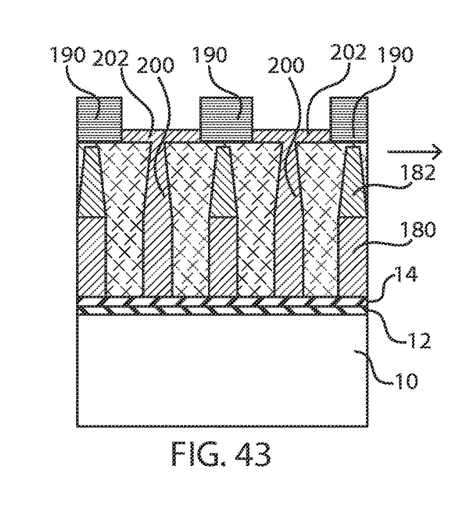
FIG. 43 is a cross-sectional view of the semiconductor structure of FIG. 42 where a metal fill takes place to fill the openings, in accordance with an embodiment of the present invention.

FIG. 43 is a cross-sectional view of the semiconductor structure of FIG. 42 where a metal fill takes place to fill the openings, in accordance with an embodiment of the present invention.

A metal fill takes place creating a first metal fill portion 200 and a second metal fill portion 202. The first metal fill portion 200 has a conical shape, whereas the second metal fill portion 202 has a rectangular shape. The combination of metal fill portions 200, 202 define a substantially or generally T-shaped configuration or a hammer shape. The metal fill portions 200, 202 can be, e.g., Ru.

In other exemplary embodiments, the conductive material of the metal fill portions 200, 202 can be copper (Cu), cobalt (Co), aluminum (Al), platinum (Pt), gold (Au), tungsten (W), titanium (Ti), or any combination thereof. The metal fill portions 200, 202 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

Figure 44:
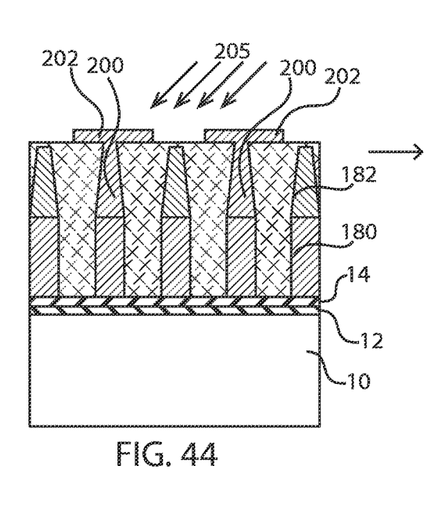
FIG. 44 is a cross-sectional view of the semiconductor structure of FIG. 43 where etching is performed to removal the insulator fill only, in accordance with an embodiment of the present invention.

FIG. 44 is a cross-sectional view of the semiconductor structure of FIG. 43 where etching is performed to removal the insulator fill only, in accordance with an embodiment of the present invention.

Etching 205 can be performed to remove the remaining insulator fill portions 190 only. The second metal fill portion 202 remains intact, thus forming the substantially or generally T-shaped configuration or a hammer shape.

Figure 45:
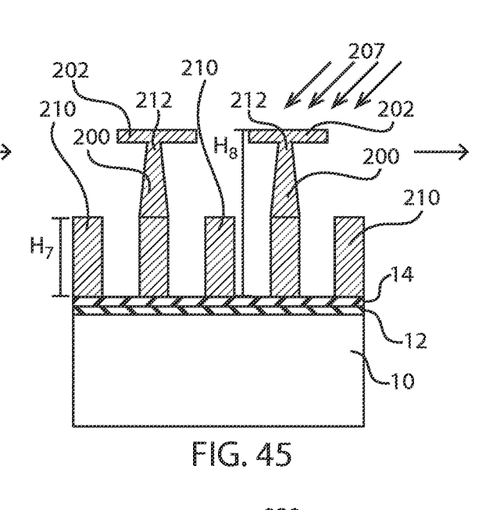
FIG. 45 is a cross-sectional view of the semiconductor structure of FIG. 44 where the spacer portions are removed, in accordance with an embodiment of the present invention.

FIG. 45 is a cross-sectional view of the semiconductor structure of FIG. 44 where the spacer portions are removed, in accordance with an embodiment of the present invention.

An etch 207 is performed to remove spacer portions 186, as well as the hardmasks 182. This results in Ru lines 210, 212. Ru lines 210 are rectangular shaped lines having a height $H_7$, whereas Ru lines 212 have a rectangular upper portion, a conical lower portion, and have a total height of $H_8$, where $H_8>H_7$. The combination of the upper portion 202 and the lower portion 200 of the Ru lines 212 defines a substantially or generally T-shaped configuration or a hammer shape.

Etching or recessing 207 can be performed by wet etch processing, as discussed above.

Figure 46:
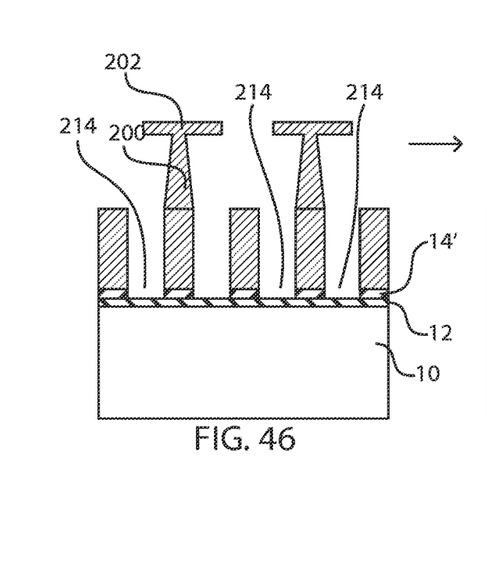
FIG. 46 is a cross-sectional view of the semiconductor structure of FIG. 45 where a TaN liner of the semiconductor stack is etched, in accordance with an embodiment of the present invention.

FIG. 46 is a cross-sectional view of the semiconductor structure of FIG. 45 where a TaN liner of the semiconductor stack is etched, in accordance with an embodiment of the present invention.

Etching 214 of the TaN liner 14 takes place resulting in TaN liner sections 14' remaining.

Figure 47:
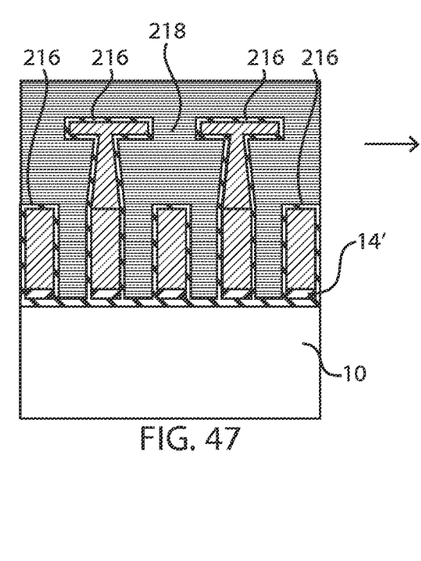
FIG. 47 is a cross-sectional view of the semiconductor structure of FIG. 46 where a metal liner and a liquid flowable CVD are deposited, in accordance with an embodiment of the present invention.

FIG. 47 is a cross-sectional view of the semiconductor structure of FIG. 46 where a metal liner and a liquid flowable CVD are deposited, in accordance with an embodiment of the present invention.

A metal liner 216 is deposited over the Ru lines 210, 212. The metal liner 216 can be, e.g., TaN. The metal liner 216 can be constructed from other metals, such as, for example, TaN/Ta, titanium, titanium nitride, cobalt, ruthenium, and manganese.

A liquid flowable chemical vapor deposition (fCVD) 218 can then be deposited.

Figure 48:
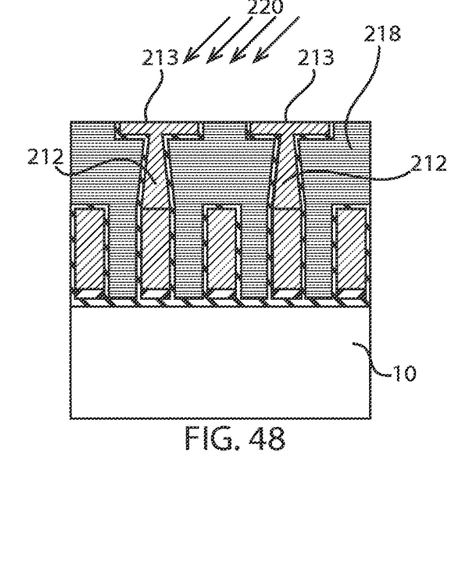
FIG. 48 is a cross-sectional view of the semiconductor structure of FIG. 47 where the liquid flowable CVD is planarized to expose a top surface of one or more of the metal lines, in accordance with an embodiment of the present invention.

FIG. 48 is a cross-sectional view of the semiconductor structure of FIG. 47 where the liquid flowable CVD is planarized to expose a top surface of one or more of the metal lines, in accordance with an embodiment of the present invention.

Planarization 220 is performed to expose a top surface 213 of the rectangular upper portion 202 of Ru lines 212. The top surface 213 of the metal line 212 is coplanar with the dielectric 218.

Thus, FIG. 48 illustrates a self-aligned via with a T-shaped or hammer shape via structure.

In conclusion, a self-aligned via and via CD controllable top via structure is constructed through a damascene via scheme. The exemplary embodiments introduce a self-aligned and tree shaped top via structure, as well as methods to obtain such a top via structure. This structure exhibits via mid-CD that is bigger than a via bottom CD and top CD. The via metal does not have to be the same material as the line. Moreover, an embodiment which includes maximized contact area between the via and the line below without over etching is presented. Other embodiments include no barrier metal existing at via bottom since the metal spacer enables to fill the via Ru without a barrier metal. Another embodiment includes no line wiggling or via distortion. Another embodiment includes composition of Ru lines (PVD Ru) and Ru vias (CVD Ru or ALD Ru) that are different. Yet another embodiment includes self-aligned and trapezoid shape via structures. This structure exhibits the largest via bottom-CD. Another embodiment includes self-aligned and hammer shaped via structures (or T-shaped via structures).

Regarding FIGS. 1-48, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming a via critical dimension (CD) controllable top via structure through a damascene via scheme (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of via formation comprising:
   forming a sacrificial mask over a conductive layer;
   forming a plurality of pillars in the sacrificial mask and the conductive layer, wherein each pillar of the plurality of pillars includes a sacrificial cap and a first conductive via;
   depositing a spacer between the plurality of pillars;
   masking at least one of the sacrificial caps;
   removing at least one of the sacrificial caps to create openings;
   forming second conductive vias in the openings; and
   depositing a dielectric coplanar to a top surface of the second conductive vias.

2. The of claim 1, wherein the conductive layer s ruthenium (Ru).

3. The method of claim 1, wherein the sacrificial cap of each pillar of the plurality of pillars is tapered.

4. The method of claim 1, wherein a top portion of the second conductive vias defines a trapezoidal shape.

5. The method of claim 1, wherein a top portion of second conductive vias defines a rectangular shape.

6. The method of claim 1, wherein a top portion of the second conductive vias defines a conical shape.

7. The method of claim 1, wherein a top portion of the second conductive vias defines a T-shaped configuration.

8. The method of claim 7, wherein the T-shaped configuration defines a first segment and a second segment, the first segment being rectangular and the second segment being conical.

9. The method of claim 1, wherein the second conductive vias are Ru vias.

10. The method of claim 1, wherein the dielectric includes a liquid flowable chemical vapor deposition (fCVD).

* * * * *